(12) United States Patent
Tsou et al.

(10) Patent No.: US 12,402,431 B2
(45) Date of Patent: Aug. 26, 2025

(54) COMPLEX SENSING DEVICE PACKAGING STRUCTURE AND PACKAGING METHOD

(71) Applicant: SENSORTEK TECHNOLOGY CORP., Jhubei (TW)

(72) Inventors: Wen-Chieh Tsou, Jhubei (TW); Yi-Hua Chang, Jhubei (TW)

(73) Assignee: Sensortek Technology Corp., Jhubei (TW)

( * ) Notice: Subject to any disclaimer, the term of this patent is extended or adjusted under 35 U.S.C. 154(b) by 628 days.

(21) Appl. No.: 17/382,806

(22) Filed: Jul. 22, 2021

(65) Prior Publication Data
US 2023/0059535 A1 Feb. 23, 2023

Related U.S. Application Data

(60) Provisional application No. 63/055,322, filed on Jul. 22, 2020.

(51) Int. Cl.
*H10F 55/25* (2025.01)
*H01L 25/16* (2023.01)
*H10F 77/50* (2025.01)

(52) U.S. Cl.
CPC .......... *H10F 55/25* (2025.01); *H01L 25/167* (2013.01); *H10F 77/50* (2025.01)

(58) Field of Classification Search
None
See application file for complete search history.

(56) References Cited

U.S. PATENT DOCUMENTS

2017/0141241 A1    5/2017  Yu et al.

FOREIGN PATENT DOCUMENTS

| CN | 110473868 A | 11/2019 |
| CN | 110556368 A | 12/2019 |
| TW | 202001202 A | 1/2020 |

OTHER PUBLICATIONS

Communication From the Taiwan Patent Office Regarding a Corresponding Foreign Application Dated (Taiwan Year 111) Jan. 17, 2022.
Search Report Issued By Taiwan Patent Office for Application No. 11120058230 on Jan. 17, 2022.
Official Action Issued by a Foreign Patent Office in Corresponding International Application No. 202110830741.2, Dated Dec. 18, 2024.

*Primary Examiner* — Sarah K Salerno
(74) *Attorney, Agent, or Firm* — Rosenberg, Klein & Lee

(57) ABSTRACT

A complex sensing device packaging structure and packaging method are disclosed. The packaging structure includes a substrate disposed with a light emitting element and a light sensing chip. A first non-transparent material is disposed on the light sensing chip. A transparent molding material surrounds the light emitting element, the light sensing chip and the first non-transparent material. A second non-transparent material is disposed inside the transparent molding material, and the second non-transparent material is connected with the first non-transparent material.

1 Claim, 8 Drawing Sheets

Dispose a light emitting element and a light sensing chip on a substrate.

Set a first opaque material on the light sensing chip.

Seal the light emitting element and the light sensing chip in a transparent molding material.

Form a shaping space on the transparent molding material which is connected to the first opaque material.

Fill the shaping space with a second opaque material connected to the first opaque material, so that the first opaque material and the second opaque material together form a shielding element.

Fig. 8

COMPLEX SENSING DEVICE PACKAGING STRUCTURE AND PACKAGING METHOD

FIELD OF THE INVENTION

The present invention relates to a complex sensing device packaging structure and packaging method, in particular to the light complex sensing device packaging structure with a shielding element and the packaging method thereof.

BACKGROUND OF THE INVENTION

Proximity sensors and ambient light sensors are widely used in portable communication devices such as mobile phones and consumer electronics. The proximity sensor and the ambient light sensor both require a light sensing element, and the proximity sensor further requires a light emitting element (e.g., an infrared transmitter or a laser emitter).

In order to avoid lights generated by the light emitting element from interfering with the light sensing element, a conventional method is to provide a shielding element between the light sensing element and the light emitting element to avoid crosstalk. A conventional packaging process is to use a metal cover or a plastic cover as the shielding element. However, the metal cover or the plastic cover are formed by a customized mold. Due to the limitation of mold manufacturing, difficulty in making the mold of the shielding element significantly increases when the shielding element miniaturizes as sizes of a circuit area and the sensors shrink. In addition, the miniaturized metal cover or miniaturized plastic cover is hard to be fixed and easily misplaced.

As shown in FIG. 1, another conventional packaging process is to cut a transparent molding material 91 that seals the light emitting element 92 and the light sensing chip 93, and then fill the cut-out groove with black resin to form a shielding element 94 to prevent the light sensing elements on the light sensing chip 93 from directly receiving the light emitted from the light emitting element 92. However, the cutting process will cause damage to the structure, so no wires or circuitry can be placed near the area where the grooves are scheduled to be cut. Thus, this approach will occupy the space for wire bonding of the light sensing chip 93, which is not conducive to miniaturized package design.

Based on the abovementioned disadvantages, it is necessary to provide a packaging structure and process for the proximity sensor and the ambient light sensor to avoid crosstalk, miniaturize size, and meet the practical requirements.

SUMMARY

It is therefore an objective of the present invention to provide a complex sensing device packaging structure and packaging method, and particularly to the complex sensing device packaging structure made by placing a first opaque material on the light sensing chip, forming a shaping space on the transparent molding material which is connected to the first opaque material, and then filling a second opaque material into the shaping space to connect the first opaque material to form a shielding element.

The present invention disclosed a complex sensing device packaging structure comprises a substrate disposed with a light emitting element and a light sensing chip; a first opaque material set on the light sensing chip; a transparent molding material enclosed the light emitting element, the light sensing chip and the first opaque material; and a second opaque material set within the transparent molding material and connected to the first opaque material.

The present invention further disclosed a complex sensing device packaging method comprises disposing a light emitting element and a light sensing chip on a substrate; setting a first opaque material on the light sensing chip; sealing the light emitting element and the light sensing chip in a transparent molding material; forming a shaping space on the transparent molding material which is connected to the first opaque material; and filling the shaping space with a second opaque material connected to the first opaque material, so that the first opaque material and the second opaque material together form a shielding element.

BRIEF DESCRIPTION OF THE DRAWINGS

FIG. 8 is a flowchart of a packaging process according to an embodiment of the present invention.

DETAILED DESCRIPTION

FIG. 2 to FIG. 7 illustrate a packaging process of a complex sensing device packaging structure according to an embodiment of the present invention. The complex sensing device packaging structure includes a substrate 10, a light emitting element 11, and a light sensing chip 12. The light sensing chip 12 is generally an application specific integrated circuit (ASIC), which is manufactured by an integrated circuit process and may contain light sensing elements and operational circuits (e.g., light sensing elements and operational circuits for a proximity sensor and/or an ambient light sensor).

Figure 1:
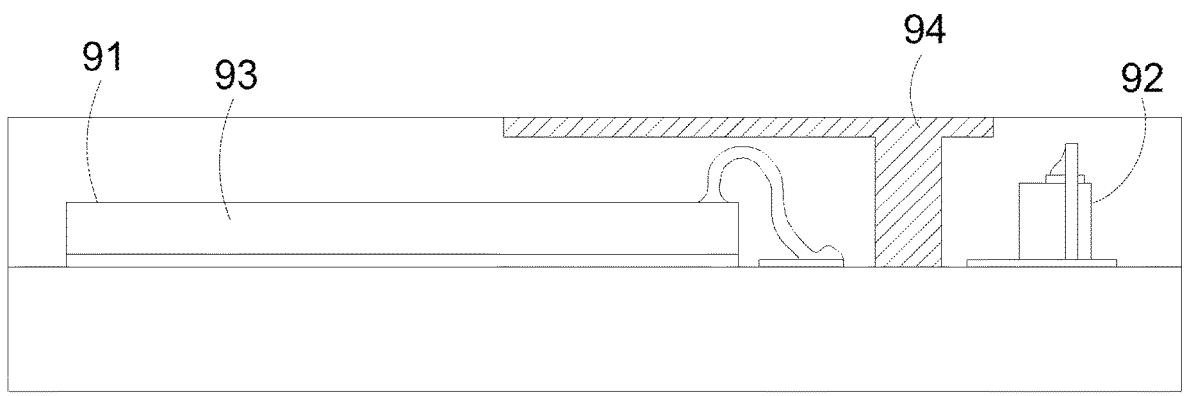
FIG. 1 illustrates a conventional packaging structure of a sensing device.
Figure 2:
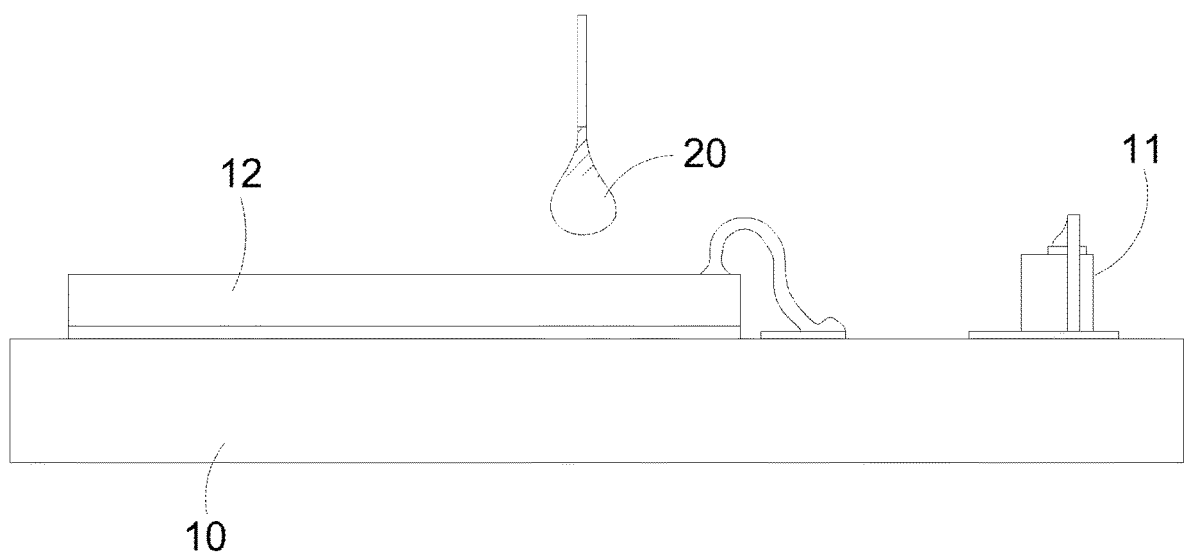
FIG. 2 to FIG. 7 illustrate a packaging process of a complex sensing device packaging structure according to an embodiment of the present invention.

As shown in FIG. 2, the light emitting element 11 and the light sensing chip 12 are disposed on the substrate 10, wherein the light emitting element 11 and the light sensing chip 12 may be connected to the substrate 10 by wire bonding. However, in addition to a wire bonding process, the light emitting element 11 and the light sensing chip 12 can be connected to the substrate 10 by other methods, which is not limited in the present invention. In an embodiment, the substrate 10 is a copper substrate, a ceramic substrate, a lead frame, a resin substrate or a printed circuit board, and the wires of the wire bonding process can be gold wires, which is not limited.

In this embodiment, the complex sensing device packaging structure can be integrated with a proximity sensor (PS) and an ambient light sensor (ALS). The light emitting element 11 is configured to generate a transmission light (e.g., an infrared light). The light sensing chip 12 is configured to receive a reflected light of the transmission light, which allows the proximity sensor to calculate distance according to the transmission light and the reflected light. In addition, the light sensing chip 12 is also configured to receive an ambient light generated by ambient light sources, which allows the ambient light sensor to calculate light intensity. In an embodiment, computation circuits and light sensing elements for the proximity sensor and the ambient light sensor are disposed in a same area of the light sensing chip 12. In another embodiment, components of the proximity sensor and components of the ambient light sensor are disposed in different areas of the light sensing chip 12, which is not limited in the present invention.

Under a limited space, in order to reduce a crosstalk between the light sensing chip 12 and the light emitting element 11, the present invention forms an opaque shielding element between the light sensing chip 12 and the light emitting element 11 to avoid light sensing chip 12 from directly receiving the transmission light generated by the light emitting element 11.

The complex sensing device packaging structure of this embodiment is first set up with a first opaque material on the light sensing chip 12. Specifically, as shown in FIG. 2, liquid opaque adhesive 20 can be dripped (including by dispensing, smearing, etc.) onto the light sensing chip 12 in this embodiment. The liquid opaque adhesive 20 may be liquid at room temperature, so it can be applied to the light sensing chip 12 without heating or pressuring. The liquid opaque adhesive 20 can cover the surface of the photographic chip 12.

Figure 3:
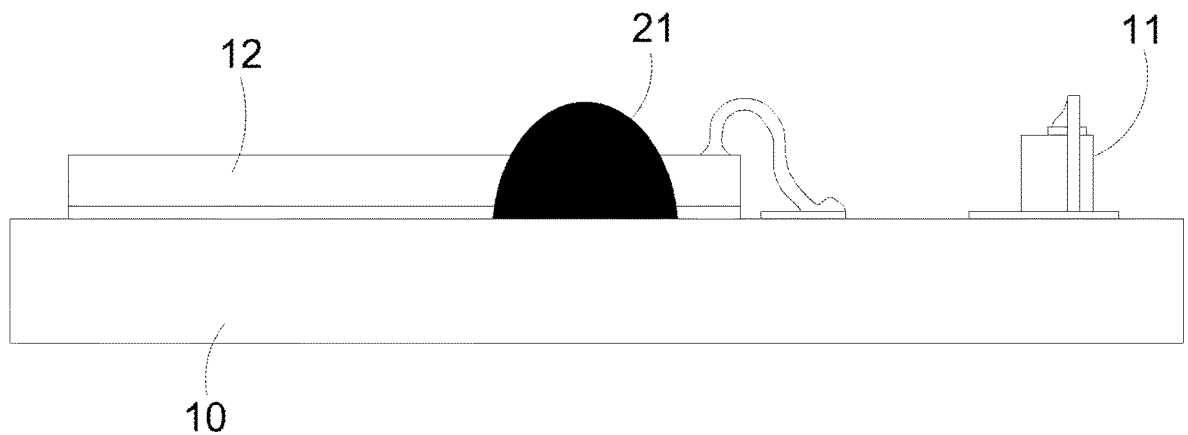

As shown in FIG. 3, a solidification process is performed to the complex sensing device packaging structure to solidify the liquid opaque adhesive 20, so as to form the first opaque material 21. The solidification process is a process to convert the liquid opaque adhesive 20 into a solid material. For example, the solidification process can be baking when the liquid opaque adhesive 20 is epoxy resin, i.e., heating the complex sensing device packaging structure to solidify. However, based on the material of the liquid opaque adhesive 20, the solidification process can be a room/low temperature solidification process (in which the liquid opaque adhesive 20 is contacted with gas or liquid to solidify), an ultraviolet solidification process, and the like.

Figure 4:
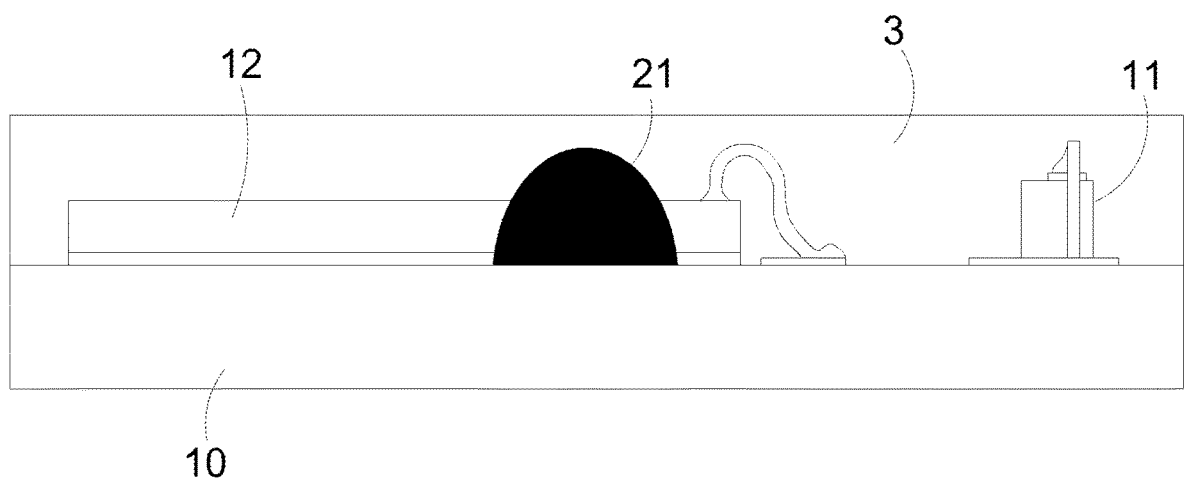

As shown in FIG. 4, the light emitting element 11 and the light sensing chip 12 are sealed in the transparent molding material 3. For example, by injecting a liquid transparent substance (e.g., resin) into a mold, forming a transparent molding material 3 after solidification the liquid transparent substance, and removing the mold to encapsulate the light emitting element 11 and the light sensing chip 12 in the transparent molding material 3.

As shown in FIG. 4, a shaping space 31 is formed on the transparent molding materials 3. The shaping space 31 is connected to the first opaque material 21. For example, in this embodiment, a cutting knife or abrasive knife can be used to cut a groove on the transparent molded material 3 to form a groove-shaped shaping space 31. The cutting process only needs to cut down to the position of the first opaque material 21, so that the shaping space 31 can be connected to the first opaque material 21, such that the first opaque material 21 is exposed in the shaping space 31. The cutting process can also partially remove a portion of the first opaque material 21 to increase the surface area of the first opaque material 21 exposed in the shaping space 31, but the present invention is not limited to this.

Figure 5:
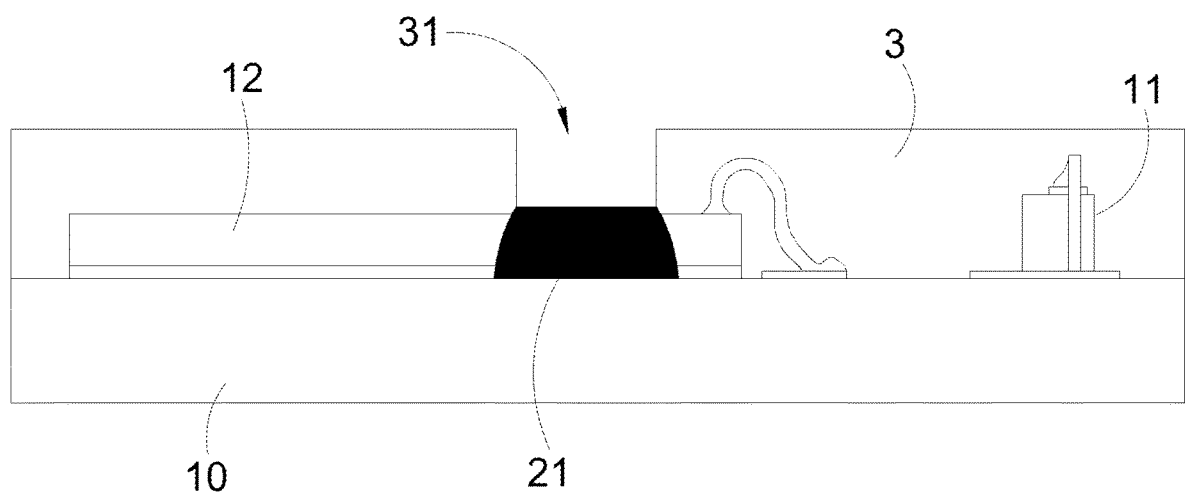

In FIG. 5, the shaping space 31 has a shape of I-shape. However in this embodiment, since the operation circuits and light sensing elements of the proximity sensor and/or the ambient light sensor can be disposed in the same area, the light sensing elements can be set far from the light emitting element 11 and the operation circuits can be set close to the light emitting element 11 during the circuit layout design, the area of the shaping space 31 can extend above the operation circuits so that the shaping space 31 has an reverse L-shape without affecting the light-sensing capability of the light sensing elements. Alternatively, in other embodiments of the present invention, the shaping space 31 may have T-shaped, funnel-shaped, or other shapes.

Figure 6:
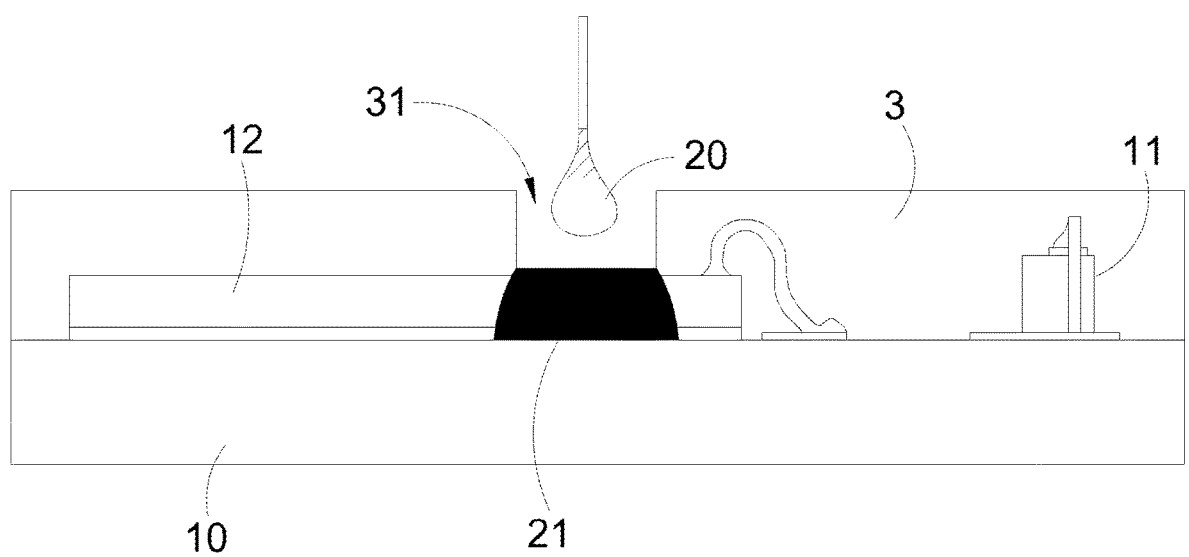
Figure 7:
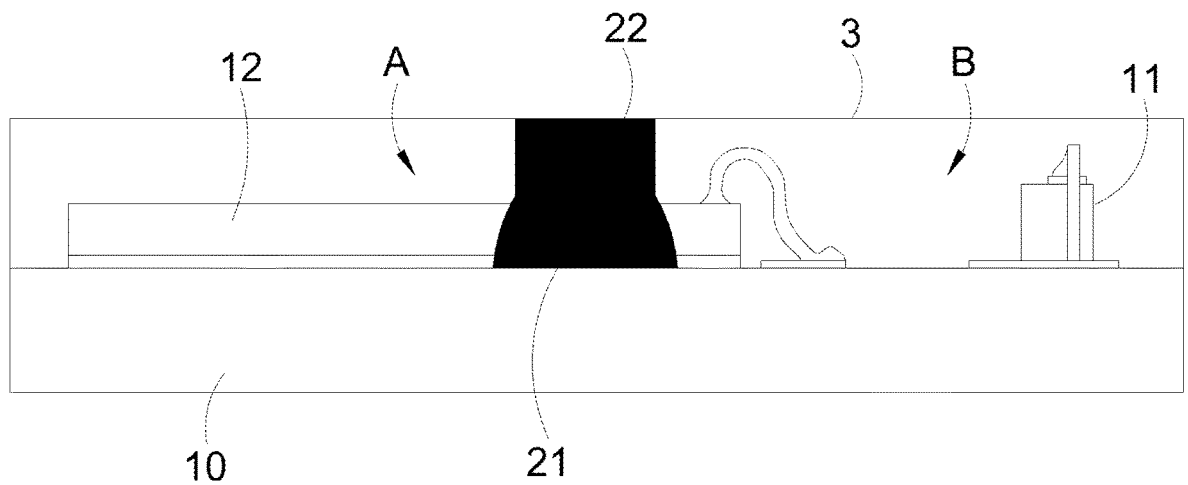

Fill the shaping space 31 with a second opaque material 22, so that the first opaque material 21 and the second opaque material 22 together form a shielding element. Specifically, as shown in FIG. 6, liquid opaque adhesive 20 can be dripped (including by dispensing, smearing, etc.) into the shaping space 31 in this embodiment. Then as shown in FIG. 7 a solidification process is performed to the complex sensing device packaging structure to solidify the liquid opaque adhesive 20, so as to form the second opaque material 22. As such, the first opaque material 21 and the second opaque material 22 can together form the shielding element.

In this embodiment, the present invention chooses the liquid opaque adhesive 20 made of epoxy resin, silicone glue, resin and silicone complex glue, or acrylic adhesive. The opaque material 20 can be an inherently opaque substance such as a black epoxy resin. The opaque material 20 can also be made opaque by doping with fillers such as dye, carbon black, silica or titanium dioxide. In this way, the first opaque material 21 and the second opaque material 22 formed after solidification of the liquid opaque adhesive 20 has light blocking effect.

The complex sensing device packaging structure according to the embodiment of the present invention provide the opaque shielding element between the light emitting element 11 and the light sensing chip 12 to avoid light sensing chip 12 from directly receiving the transmission light generated by the light emitting element 11. In such a structure, the transmission light generated by the light emitting element 11 may propagate through the transparent molding material 3, the ambient light and the reflected light may propagate through the transparent molding material 3 to be received by a light sensing area "A" of the light sensing chop 12, and the shielding element between the light emitting element 11 and the light sensing chip 12 may avoid the transmission light generated by the light emitting element 11 from directly receiving by the light sensing chip 12, which satisfies the need of light transmission/reception and reduces crosstalk.

It is noteworthy that, in the conventional packaging process, which is to directly cut the transparent molding material 91, and then fill the cut-out groove with black resin to form the shielding element 94, it will occupy the space of the light sensing chip 93 which should be used for wire bonding. In comparison, in the complex sensing device packaging structure according to the embodiment of the present invention, a first opaque material 21 is first set onto the light sensing chop 12, and the light emitting element 11, the light sensing chip 12 and the first opaque material 21 are sealed in a transparent molding material 3, then the formation of a second opaque material 21 on the transparent molding material 3 to connect the first opaque material 21 is made. Accordingly, the process of cutting the transparent molded material 3 to form the shaping space 31 for the second opaque material 21 only needs to cut down to the position of the first opaque material 21, and does not cause any damage to the light sensing chip 12 and the light emitting element 11. Therefore, there is no need to reserve space on the substrate 10 for the cutting process, and it will not occupy the circuit setup space of the light sensing chip 12, nor will it occupy the space for the wire bonding of the light sensing chip 12 and the light emitting element 11, meeting the requirement of miniaturized packaging.

Further in details, please refer to FIG. 7. The complex sensing device packaging structure according to the embodiment of the present invention is to form the first opaque material 21 by applying liquid opaque adhesive 20 to the surface of the light sensing chip 12 and covering it on the surface of the light sensing chip 12. This method does not cause structural damage, and its process has less difficulty.

Such method only have to ensure that the first opaque material 21 is formed between the light sensing area "A" of the light sensing chip 12 and the light emitting element 11, which has higher practicality and operational flexibility. On the other hand, a separation area "B" between the first opaque material 21 and the light emitting element 11 will not be cut in. Therefore, the substrate 10 can be set up for the circuitry or wires of the light emitting element 11 and the light sensing chip 12, so that the distance between the light emitting element 11 and the light sensing chip 12 can be further shortened to achieve the purpose of miniaturization.

The manufacturing method for the complex sensing device packaging structures can be summarized into a packaging process, as shown in FIG. 8, the packaging process includes but not limited the following steps.

Dispose a light emitting element and a light sensing chip on a substrate.

Set a first opaque material on the light sensing chip.

Seal the light emitting element and the light sensing chip in a transparent molding material.

Form a shaping space on the transparent molding material which is connected to the first opaque material. The shaping space may be formed by cutting the transparent molding material.

Fill the shaping space with a second opaque material connected to the first opaque material, so that the first opaque material and the second opaque material together form a shielding element.

In sum, by placing a first opaque material on the light sensing chip, forming a shaping space on the transparent molding material which is connected to the first opaque material, and then filling a second opaque material into the shaping space to connect the first opaque material to form a shielding element, the complex sensing device packaging structure and its packaging method of the present invention can not only reduce the crosstalk between the light emitting element and the light sensing chip, but also reduce the process difficulty and shorten the distance between the light emitting element and the light sensing chip to meet the needs of miniaturized packaging.

By means of the above-disclosed embodiment of the present invention, a person skilled in the art may think of simple variations of the invention. For example, as shown in FIG. 5, instead of cutting the transparent molded material 3 to form the shaping space 31, a mold can be covered onto the complex sensing device packaging structure and abutted against the first opaque material 21, and a liquid transparent substance (e.g., a resin) can be injected into the mold to form the transparent molded material 3 after solidification, and the mold abutted against the first opaque material 21 can be removed. In this way, the light emitting element 11, the light sensing chip 12 and the first opaque substance 21 can be sealed in the transparent molding material 3, and the molding space 31 connected to the first opaque substance 21 can be formed together. This approach has the advantage of further streamlining the manufacturing process, but has the disadvantage of low process flexibility (e.g., the molds cannot be reused in different sizes of composite sensor device packaging structures). The former approach of cutting by cutting knife or abrasive knife to form the shaping spaces 31 is more flexible (e.g., cutting knife or abrasive knife can be utilized to shape diverse shapes). a person skilled in the art n can choose the shaping method for the shaping space according to the actual needs.

Those skilled in the art will readily observe that numerous modifications and alterations of the device and method can be made while retaining the teachings of the invention. Accordingly, the above disclosure should be construed as limited only by the metes and bounds of the appended claims.

The invention claimed is:

1. A complex sensing device packaging method, comprising:
    disposing a light emitting element and a light sensing chip on a substrate;
    setting a first opaque material on the light sensing chip;
    sealing the light emitting element and the light sensing chip in a transparent molding material, wherein further includes abutting a mold against the first opaque material, injecting a liquid transparent substance into the mold to form the transparent molded material after solidification, and removing the mold abutted against the first opaque material to form a shaping space on the transparent molding material which is connected to the first opaque material; and
    filling the shaping space with a second opaque material connected to the first opaque material, so that the first opaque material and the second opaque material together form a shielding element.

* * * * *